(12) United States Patent
Kang et al.

(10) Patent No.: US 7,776,687 B2
(45) Date of Patent: Aug. 17, 2010

(54) SEMICONDUCTOR DEVICE HAVING A GATE CONTACT STRUCTURE CAPABLE OF REDUCING INTERFACIAL RESISTANCE AND METHOD OF FORMING THE SAME

(75) Inventors: Chang-Seok Kang, Seongnam-si (KR);
Yoo-Cheol Shin, Suwon-si (KR);
Jung-Dal Choi, Suwon-si (KR);
Jong-Sun Sel, Yongin-si (KR);
Ju-Hyung Kim, Yongin-si (KR);
Sang-Hun Jeon, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 461 days.

(21) Appl. No.: 11/797,401

(22) Filed: May 3, 2007

(65) Prior Publication Data
US 2007/0257302 A1    Nov. 8, 2007

(30) Foreign Application Priority Data
May 3, 2006    (KR)    ............ 10-2006-0040121

(51) Int. Cl.
*H01L 21/336*    (2006.01)
(52) U.S. Cl. ............. 438/257; 438/239; 257/E21.179

(58) Field of Classification Search ............. 438/257, 438/238, 239, 250, 253, 254, 255
See application file for complete search history.

(56) References Cited

U.S. PATENT DOCUMENTS 5,837,605 A      11/1998 Park et al.
6,781,193 B2 *    8/2004 Lee et al. ............... 257/326

FOREIGN PATENT DOCUMENTS

| JP | 2001-127158 | 5/2001 |
|----|---|---|
| JP | 2003-142683 | 5/2003 |
| KR | 10-0141165 B1 | 7/1998 |
| KR | 10-2001-0005396 A | 1/2001 |
| KR | 10-2001-0060039 A | 7/2001 |
| KR | 10-2002-0017103 | 3/2002 |
| KR | 10-2002-0043931 | 6/2002 |

* cited by examiner

*Primary Examiner*—Walter L Lindsay, Jr.
*Assistant Examiner*—Reema Patel
(74) *Attorney, Agent, or Firm*—Lee & Morse P.C.

(57) ABSTRACT

A semiconductor device has a gate contact structure, including a semiconductor substrate, a polycrystalline silicon layer used as a gate electrode of a transistor, a middle conductive layer, a top metal layer having an opening exposing the polycrystalline silicon layer, and a contact plug directly contacting the polycrystalline silicon layer through the opening.

21 Claims, 17 Drawing Sheets

Lm = Minimum pulse width allowed

SEMICONDUCTOR DEVICE HAVING A GATE CONTACT STRUCTURE CAPABLE OF REDUCING INTERFACIAL RESISTANCE AND METHOD OF FORMING THE SAME

BACKGROUND OF THE INVENTION

1. Field of the Invention

The present invention relates to a semiconductor device and method of forming the same. More particularly, the present invention relates to a semiconductor device having a gate contact structure capable of reducing interfacial resistance and a method of forming the same.

2. Description of the Related Art

The line width of patterns composing a semiconductor device constitute an important parameter which determines an integration density of the semiconductor device. In order to increase the integration density of the semiconductor device, the line width of the patterns may be decreased to a level corresponding to an increase of the integration density. However, with conductive patterns such as gate electrodes and interconnections, the line width decrease results in an electric resistance increase which leads to resistive capacitive (RC) delay. Conventional gate electrodes may be made of a silicon-based conductive material, e.g., n+ polysilicon and/or silicide having high specific resistance, etc. Technical problems due to the line width decrease become more serious for the gate electrode than the interconnections made of metallic material.

Metal gate technologies have been proposed for forming the gate electrodes with a metallic material having low specific resistance. One of these suggested technologies for forming the gate electrodes may utilize tungsten gate (W-gate) technology, where the specific resistance may be about $5.5 \times 10^{-8}$ $\Omega$nm. Compared to this, the specific resistance of tungsten silicide ($WSi_x$) may be about $3 \times 10^{-7}$ $\Omega$m to $7 \times 10^{-7}$ $\Omega$m, and the specific resistance of n+ polysilicon may be about $10^{-5}$ $\Omega$m. Notwithstanding the low specific resistance of tungsten, if the tungsten comes in direct contact with a gate insulating layer, technical problems such as degradation of reliability of the gate insulating layer may occur.

Therefore, when using the tungsten-gate, as illustrated in FIG. 1, a polysilicon layer 30 and a barrier metal layer 40 may be sequentially stacked between a tungsten layer 50 and a gate insulating layer 20 over a substrate 10. Impurity regions 25 may define source/drain regions. The barrier metal layer 40 may serve to prevent interfacial reaction and inter-diffusion between the polysilicon layer 30 and the tungsten layer 50. Metal nitride, e.g., tungsten nitride (WN) and/or titanium nitride (TiN), may be used for the barrier metal layer 40.

However, when the barrier metal layer 40 made of metal nitride is in contact with the polysilicon layer 30, an electrical contact resistance between them may appear to violate Ohm's Law. Specifically, the contact resistance may be larger compared with when an ohmic contact layer is used. This increase of contact resistance causes various technical problems.

For example, as shown in FIG. 2, an increase of interfacial contact resistance due to non-ohmic contact results in a signal delay of the circuit forming an inverter. The signal delay decreases the width of pulses L0 . . . Ln generated in the latch circuits LCH0 . . . LCHn, which constitute a page buffer of a FLASH memory. Therefore, a width of a generating pulse may be shorter than a length required in the nth latch circuit, and thus the FLASH memory may not operate normally. These technical problems may be commonly found in most general metal gate structures having a polysilicon layer.

Nonetheless, due to pitting of active region, it is difficult to overcome these technical problems by the methods suggested by related art technologies.

More specifically, the gate structure may be electrically connected to the interconnection 70 by using a gate contact plug 60. In addition, impurity regions 15 may be formed on both sides of the gate structures, and the impurity regions 15 may be electrically connected to the interconnection 70 by using source/drain contact plugs 65. Contact holes for the gate contact plug 60 and source/drain contact plugs 65 may be formed simultaneously. Accordingly, the tungsten layer 50 and the barrier metal layer 40 may be further etched by a sum of their width (D), such that the gate contact plug 60 may be connected with the polysilicon layer 30. However, this additional etching may cause an excessive-etching of the impurity regions 15 (i.e. active-fitting). Therefore, although the gate contact plug 60 is in direct contact the tungsten layer 50, it becomes difficult to connect to the polysilicon layer 30.

The above information disclosed in this Background section is only for enhancement of understanding of the background of the invention, and therefore it may contain information that does not form the prior art that is already known in this country to a person of ordinary skill in the art.

SUMMARY OF THE INVENTION

The present invention is therefore directed to a semiconductor device having a gate contact structure and a method of manufacturing the same, which substantially overcome one or more of the problems due to the limitations and disadvantages of the related art.

At least one of the above and other features and advantages of the present invention may be realized by providing a semiconductor device which may include a polysilicon layer on a substrate, the polysilicon layer being a gate electrode of a transistor, a middle conductive layer and a top metal layer on the polysilicon layer, an opening through the middle conductive layer and the top metal layer exposing the polysilicon layer, and a contact plug directly connected with the polysilicon layer through the opening.

The top metal layer may include at least one of tungsten, copper, aluminum, gold, silver, platinum, or palladium, and the middle conductive layer may include at least one of metal nitride, conductive metal oxide, metal silicide, or metal nitride containing at least one of silicon or aluminum. The contact plug may be directly connected with the top metal layer and the middle conductive layer. The device may also include an insulating layer between the contact plug and a sidewall of the opening, the insulating layer separating the contact plug from the top metal layer and the middle conductive layer.

At least one of the above and other features and advantages of the present invention may be realized by providing a semiconductor device which may include a semiconductor substrate including a first region and a second region, a first gate structure on the first region, the first gate structure including a polysilicon layer and a first top metal layer, a second gate structure on the second region, the second gate structure including a bottom conductive layer and a second top metal layer, a first contact plug connected directly with the polysilicon layer of the first gate structure, and a second contact plug connected directly with the second top metal layer of the second gate structure.

The first top metal layer and the second top metal layer may be made of a substantially same material, and the first top metal layer and the second top metal layer may have a substantially same thickness. Each of the first top metal layer and the second top metal layer may be made of at least one of tungsten, copper, aluminum, gold, silver, platinum, or palladium. The device may further include a first middle conductive layer between the first top metal layer and the polysilicon layer, and a second middle conductive layer between the second top metal layer and the bottom conductive layer. The first gate structure may include an opening penetrating the first top metal layer and the first middle conductive layer and exposing the polysilicon layer, and the first contact plug is directly connected to the polysilicon layer through the opening. The opening may penetrate the first top metal layer and the first middle conductive layer, and the first contact plug may fill the opening such that the contact plug is directly connected with the first top metal layer and the first middle conductive layer. The device may further include an insulating layer between the first contact plug and both the first top metal layer and the first middle conductive layer, where the insulating layer separates the first contact plug from the first top metal layer and the first middle conductive layer. The first middle conductive layer and the second middle conductive layer may be made of a substantially same material having a substantially same thickness. The bottom conductive layer may be made of at least one metal nitride, and the first middle conductive layer and the second middle conductive layer may be made of at least one of metal nitride, conductive metal oxide, metal silicide, or metal nitride including at least one of silicon or aluminum. The metal nitride may be at least one of TaN, TiN or WN, the conductive metal oxide may be at least one of $IrO_2$ or $RuO_2$, the metal silicides may be at least one of WSi, TiSi or CoSi, and the metal nitride may be at least one of TiSiN, TaSiN, TaAlN or TiAlN.

The semiconductor substrate may contain a memory cell array region where memory transistors and selective transistors are arrayed, and a peripheral circuit region where peripheral transistors connected to the memory and the selective transistors are arrayed. The memory transistors may be nonvolatile memory transistors each having a memory gate insulating layer and a charge storage structure stacked sequentially between a gate electrode and the semiconductor substrate. The peripheral transistors may be MOS transistors each having a peripheral gate insulating layer between a gate electrode and the semiconductor substrate. The selective transistors may be MOS transistors each having a selective gate insulating layer between a gate electrode and the semiconductor substrate. The first gate structure may be at least one gate electrode of the selective transistors and the peripheral transistors, and the second gate structure may be at least one gate electrode of the memory transistors and the selective transistors.

At least one of the above and other features and advantages of the present invention may be realized by providing a method of forming a semiconductor device, which may include forming a first gate structure and a second gate structure on a semiconductor substrate, the first gate structure including a polysilicon layer, a first middle conductive layer, and a first top metal layer, and the second gate structure including a bottom conductive layer, a second middle conductive layer, and a second top metal layer stacked sequentially, forming an interlayer dielectric layer on the first and the second gate structures, forming a first gate contact hole and a second gate contact hole to expose top surfaces of the first and the second top metal layers by patterning the interlayer dielectric layer, forming an extended first gate contact hole to expose the polysilicon layer by selectively etching the first top metal layer exposed through the first gate contact hole, and forming contact plugs to fill the extended first gate contact hole and the second gate contact hole.

The bottom conductive layer may include at least one metal nitride, and the first middle conductive layer and the second middle conductive layer respectively may include at least one metal nitride, conductive metal oxide, metal silicide, or metal nitride including silicon or aluminum. The method may further include forming an etch stopping layer covering and conforming to the first and the second gate structures, where forming the first and the second gate contact holes may include patterning the interlayer dielectric layer using an etchant formulation having etch selectivity to the etch stopping layer, and patterning the etch stopping layer exposed through the patterned interlayer dielectric layer to expose top surfaces of the first and the second top metal layers. Patterning the dielectric layer may include forming source/drain contact holes exposing the semiconductor substrate at sides of the first and the second gate structures, where the source/drain contact holes are formed simultaneously when the first and the second gate contact holes are formed. Forming the first gate contact hole may include forming a mask pattern covering the second gate contact hole and exposing the first gate contact hole, and etching the first gate contact hole using the mask pattern as an etch mask. The contact plug filling the first gate contact hole may fill the first gate contact hole to be directly connected with the polysilicon layer, the first middle conductive layer, and the first top metal layer, and the contact plug filling the second gate contact hole may be directly connected with the bottom conductive layer, the second middle conductive layer, and the second top metal layer.

At least one of the above and other features and advantages of the present invention may be realized by providing a method of forming a semiconductor device, which may include forming a first gate structure and a second gate structure on a semiconductor substrate, the first gate structure including a polysilicon layer, a first middle conductive layer and a first top metal layer, the first middle conductive layer and the first top metal layer exposing a portion of a top surface of the polysilicon layer, and the second gate structure including a bottom conductive layer, a second middle conductive layer and a second top metal layer, forming an interlayer dielectric layer on the first and the second gate structures, patterning the interlayer dielectric layer to form a first gate contact hole and a second gate contact hole respectively exposing top surfaces of the polysilicon layer of the first gate structure and the second top metal layer of the second gate structure, and forming contact plugs connected with the polysilicon layer and the second top metal layer through the first gate contact hole and the second contact hole.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
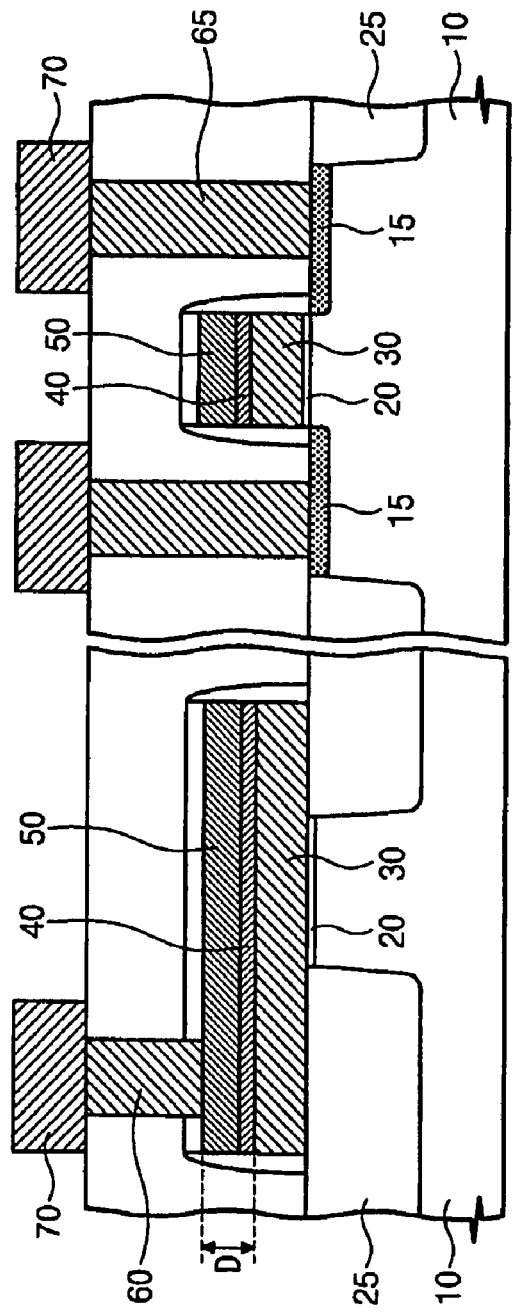
FIG. 1 illustrates a cross-sectional view of a semiconductor device having contact plug structures according to the related art.
Figure 2:
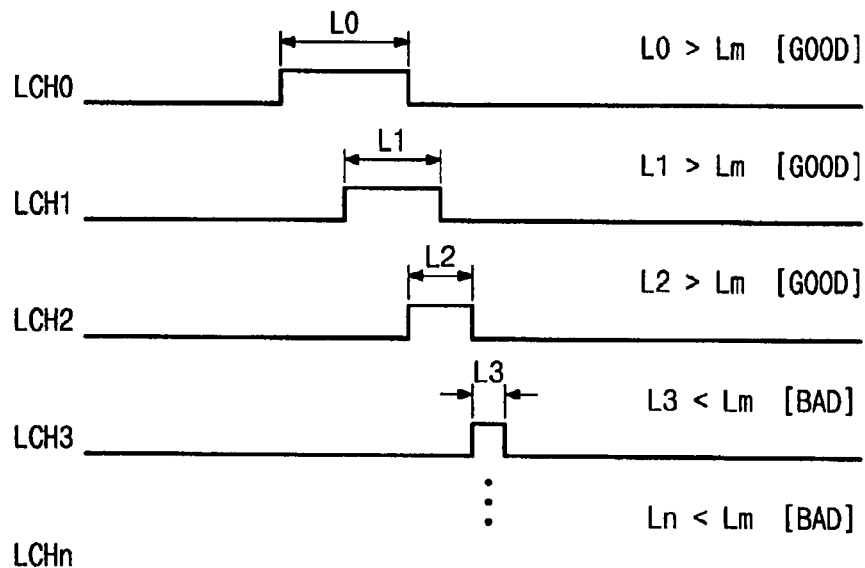
FIG. 2 illustrates a timing diagram of the decreasing effect of the pulse width in latch circuits configuring a page buffer of a FLASH memory.

Korean Patent Application No. 2006-40121, filed on May 3, 2006, in the Korean Intellectual Property Office, and entitled: "Semiconductor Devices Having Gate Contact Structure Capable of Reducing Interfacial Resistance and Methods of Forming the Same," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

According to the present invention, a gate contact plug may be in direct contact with a polysilicon layer forming a gate pattern. Therefore, an increase of interfacial resistance occurring between the polysilicon and the metal nitride may be overcome.

Figure 3:
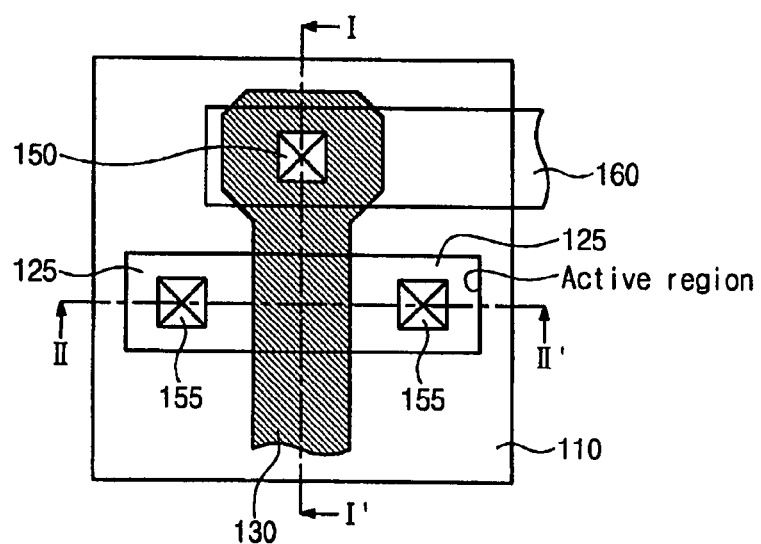
FIG. 3 illustrates a plan view of a contact plug structure according to an embodiment of the present invention.
Figure 4:
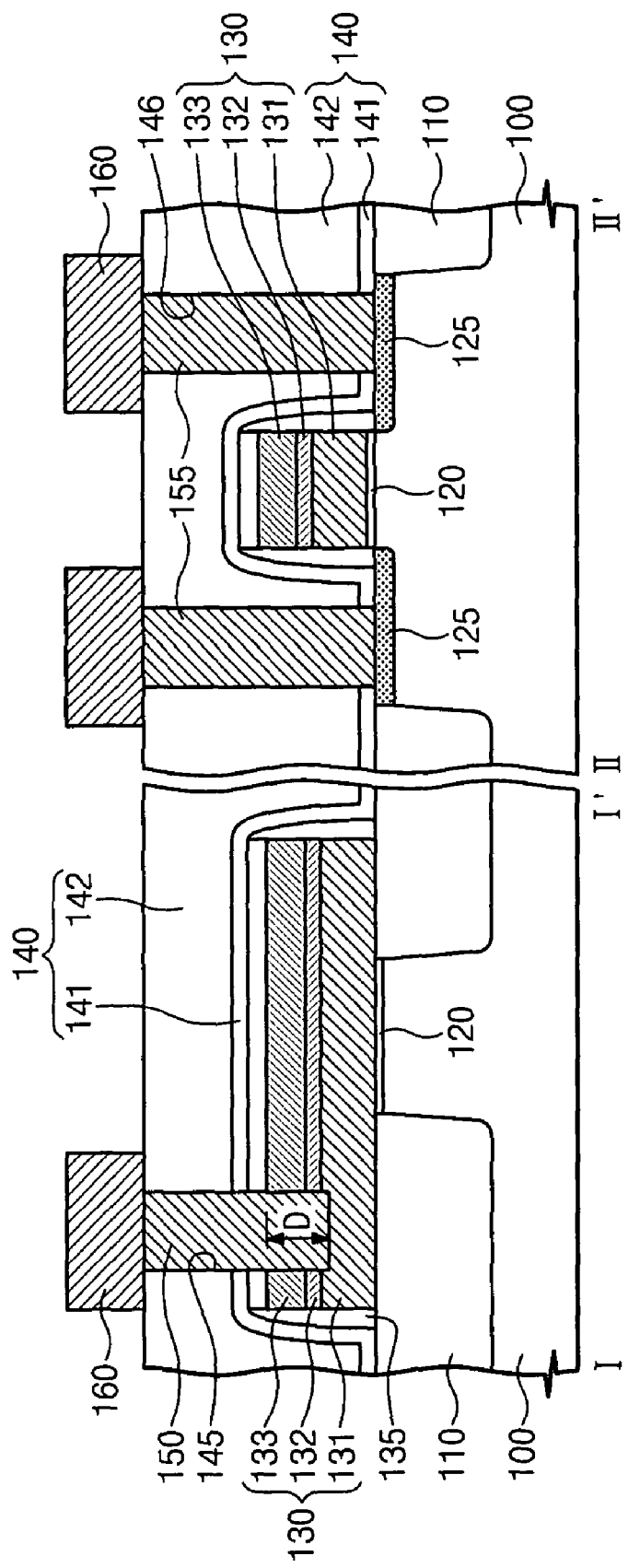
FIG. 4 illustrates cross-sectional views along lines I-I' and II-II' of FIG. 3 according to an embodiment of the present invention.
Figure 5:
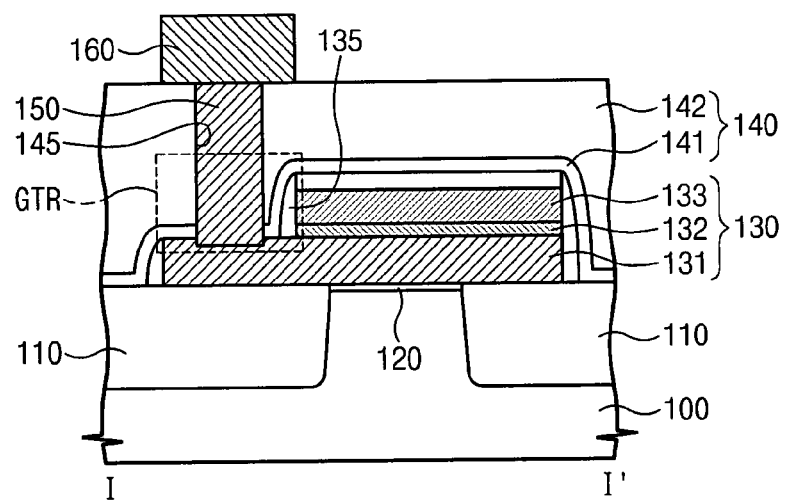
FIG. 5 illustrates a cross-sectional view along line I-I' of FIG. 3 according to another embodiment of the present invention.
Figure 6:
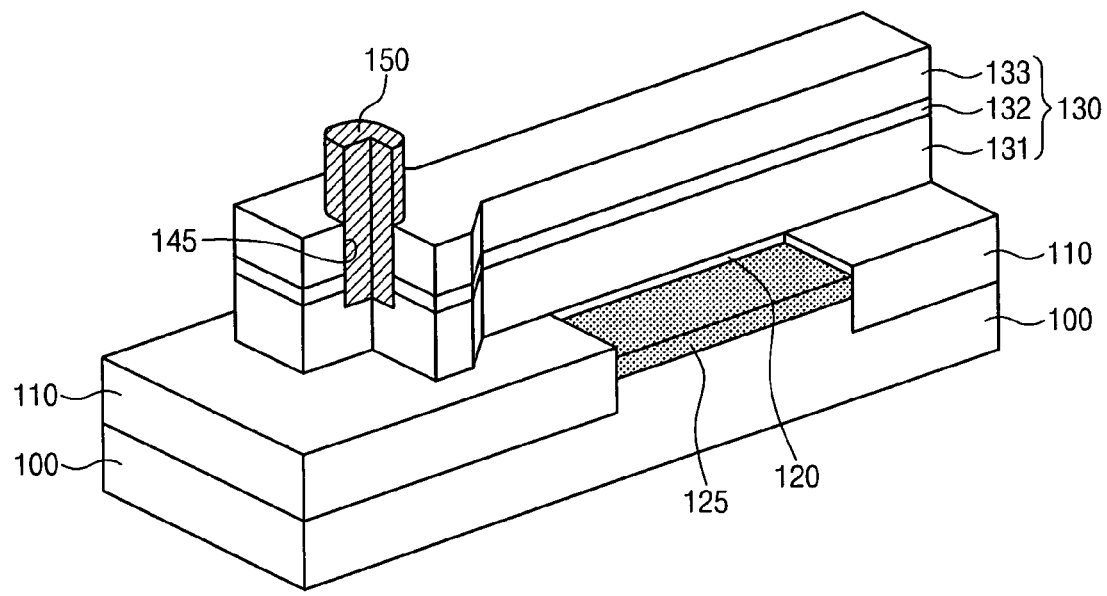
FIG. 6 and FIG. 7 illustrate perspective views of a transistor structure having a contact plug structure according to an embodiment of the present invention.
Figure 7:
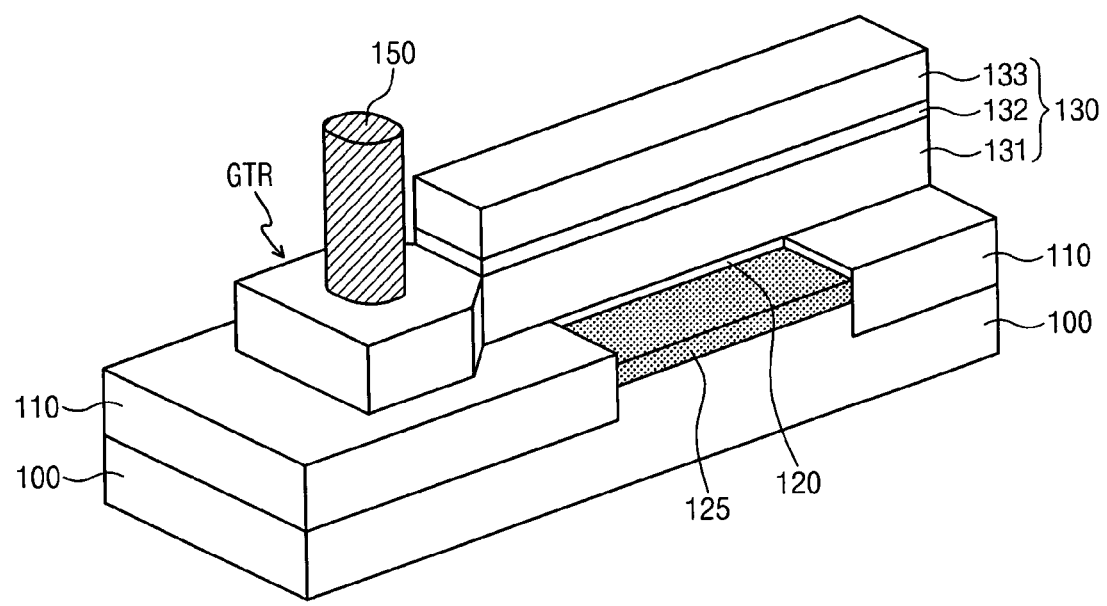

FIG. 3 illustrates a plan view of a contact plug structure according to an embodiment of the present invention. FIG. 4 illustrates cross-sectional views along lines I-I' and II-II' of FIG. 3 according to an embodiment of the present invention. FIG. 5 illustrates a cross-sectional view along line I-I' of FIG. 3 according to another embodiment of the present invention. FIG. 6 and FIG. 7 illustrate perspective views of transistors having the contact plug structures according to embodiments of the present invention.

Referring to FIG. 3 and FIG. 4, a device isolating layer 110 may be formed to define active regions in predetermined regions of the semiconductor substrate 100. A gate insulating layer 120 may be on the active region. A gate pattern 130 may be on top of the gate interlayer dielectric 120, and the gate pattern 130 may extend to a top of the device isolating layer 110 across the active region. The gate pattern 130 may be used as a gate electrode of the transistor. Impurity regions 125, which may be used as the source/drain electrodes of the transistors, may be formed in the active region at both sides of the gate pattern 130. An interlayer dielectric 140 may be formed on the gate pattern 130, and the gate pattern 130 and the interconnections 160 crossing over the impurity regions 125 may be formed on the interlayer dielectric 140.

The gate pattern 130 may be a metal gate structure composed of at least one layer made of metallic material. The gate pattern 130 may include a polysilicon layer 131, a middle conductive layer 132 and a top metal layer 133, which are sequentially stacked. The polysilicon layer 131 may be formed of n+ polysilicon, and the middle conductive layer 132 may be formed of at least one selected from, e.g., a metal nitride ($MN_x$), a conductive metal oxide ($MO_x$), a metal silicide ($M_xSi_y$), a metal nitride composed of silicon and/or aluminum ($MSi_xAl_yN_z$), etc. The top metal layer 133 may be made of at least one metal selected from, e.g., tungsten (W), copper (Cu), aluminum (Al), gold (Au), silver (Ag), platinum (Pt), palladium (Pd), etc. The metal nitride may be one of, e.g., tantalum nitride (TaN), titanium nitride (TiN), tungsten nitride (WN), etc. The conductive metal oxide may be, e.g., iridium oxide ($IrO_2$), ruthenium oxide ($RuO_2$), etc. The metal silicide may be one of, e.g., tungsten silicide (WSi), titanium silicide (TiSi), cobalt silicide (CoSi), etc. The metal nitride containing silicon or aluminum may be, e.g., titanium silicon nitride (TiSiN), tantalum silicon nitride (TaSiN), tantalum aluminum nitride (TaAlN), titanium aluminum nitride (TiAlN), etc. The middle conductive layer 132 and the top metal layer 133 may be a WN layer and a W layer, respectively.

The interconnections 160 may be electrically connected to the gate pattern 130 and the impurity regions 125 through the gate contact plug 150 and the active contact plug 155. The gate contact plug 150 and the active contact plug 155 may fill the gate contact hole 145 and the active contact hole 146, respectively, and may penetrate the interlayer dielectric 140, as illustrated in FIG. 4. The gate contact hole 145 may penetrate the top metal layer 133 and the middle conductive layer 132 to expose a top surface of the polysilicon layer 131. As a result, the gate contact plug 150 may be in direct contact with each of the polysilicon layer 131, the middle conductive layer 132 and the top metal layer 133, as illustrated in FIGS. 4 and 6.

The interlayer dielectric 140 may include a lower interlayer dielectric 141 and an upper interlayer dielectric 142, which may be sequentially stacked. The upper interlayer dielectric 142 may be formed of insulating material composed of, e.g., silicon oxide, and the lower interlayer dielectric 141 may be formed to cover and conform to the resultant structure where the gate patterns 130 is formed. The lower interlayer dielectric 141 may be made of material having etch selectivity to the upper interlayer dielectric 142. The language "a layer B has etch selectivity to a layer A" means that the layer A may be selectively etched while minimizing the etching of layer B.

The upper interlayer dielectric 142 may be made of, e.g., silicon oxide and the lower interlayer dielectric 141 may be made of, e.g., silicon nitride.

The gate contact plug 150 may alternately only be in direct contact with the top surface of the polysilicon layer 131 among the layers composing of the gate pattern 130. In other words, the gate contact plug 150 may be separated from the middle conductive layer 132 and the top metal layer 133 to be connected with the polysilicon layer 131. More specifically, referring to FIGS. 3, 5, and 7, the top metal layer 133 and middle conductive layer 132 of the gate pattern 130 may be formed to expose the top surface of the polysilicon layer 131 in the gate contact region GTR, and the gate contact plug 150 may be in the gate contact region GTR to be in contact with the polysilicon layer 131. In this case, the interlayer dielectric 140 and a gate spacer 135 on sidewalls of the gate pattern 130 may be interposed between a sidewall of the gate contact plug 150 and sidewalls of the middle conductive layer 132 and top metal layer 133.

The aforementioned gate pattern 130 and gate contact plug 150 may be used for all the transistors constructing a semiconductor device. However, referring to FIGS. 8 to 12, a portion of the transistors constructing the semiconductor device may have the aforementioned structure of gate pattern 130 and gate contact plug 150, but another portion of the transistors may have a different structure.

An embodiment of the present invention disclosed will now be described which relates to a FLASH memory having a NAND-type cell array structure. However this technology may also be applied to FLASH memory devices having other types of structure (for example, NOR-type).

Figure 8:
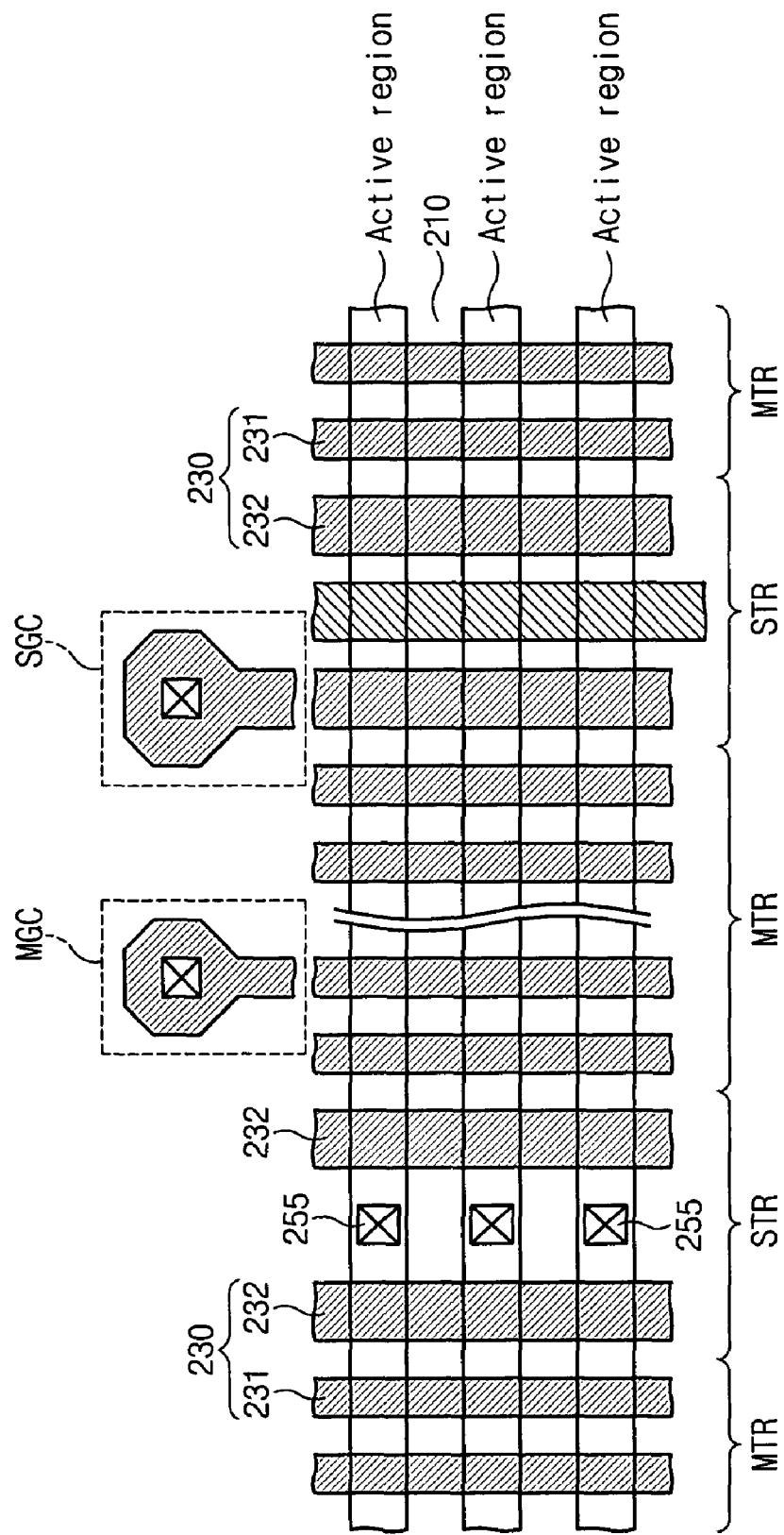
FIG. 8 illustrates a plan view of a cell array of a FLASH memory device having a contact plug structure according to an embodiment of the present invention.
Figure 9:
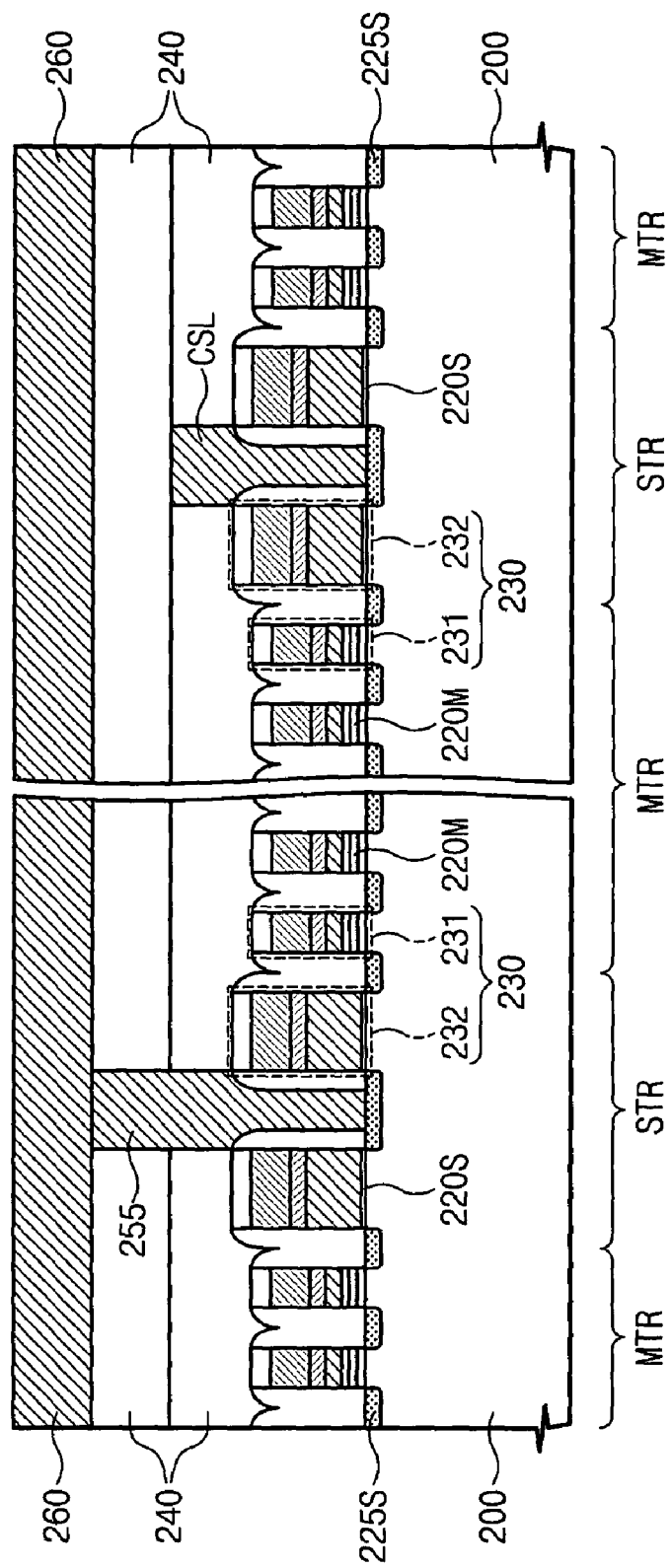
FIG. 9 illustrates a cross-sectional view of a cell array of a FLASH memory device having a contact plug structure according to an embodiment of the present invention.
Figure 10:
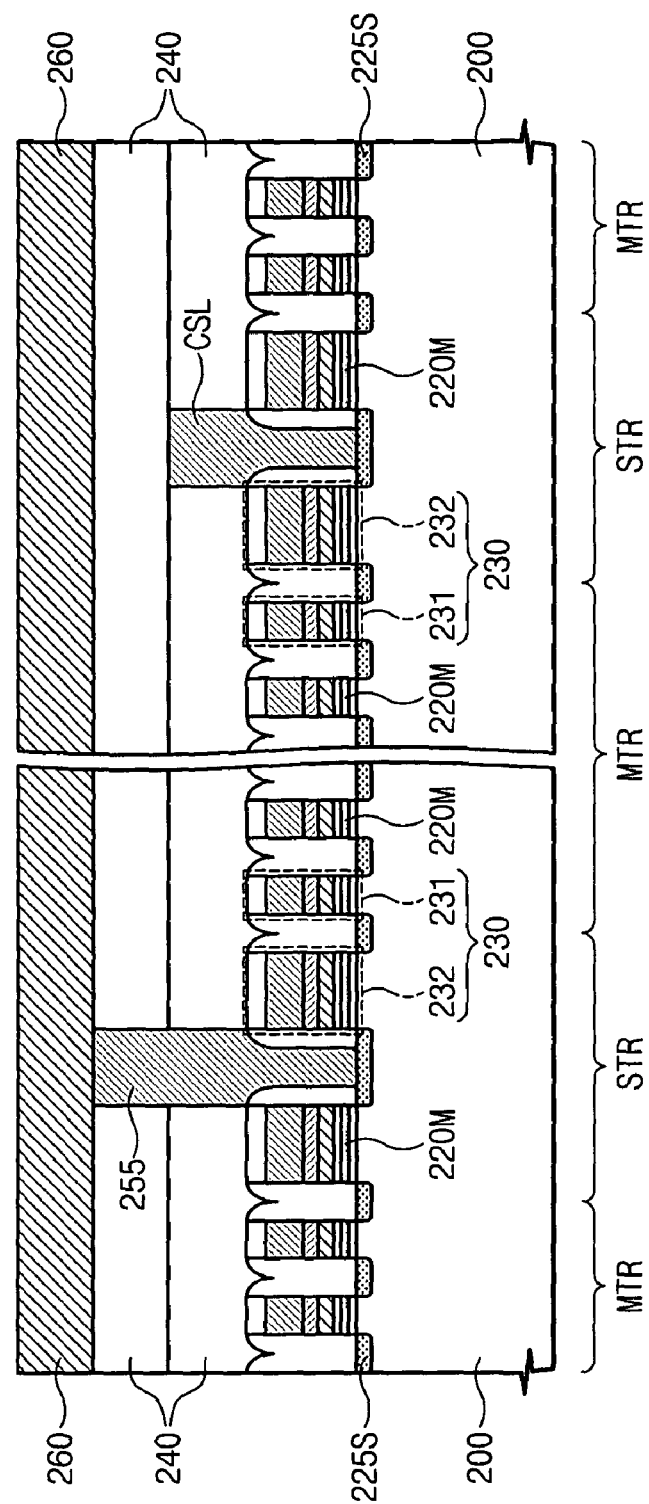
FIG. 10 illustrates a perspective view of a cell array of FLASH memory device having a contact plug structure according to an embodiment of the present invention.
Figure 11:
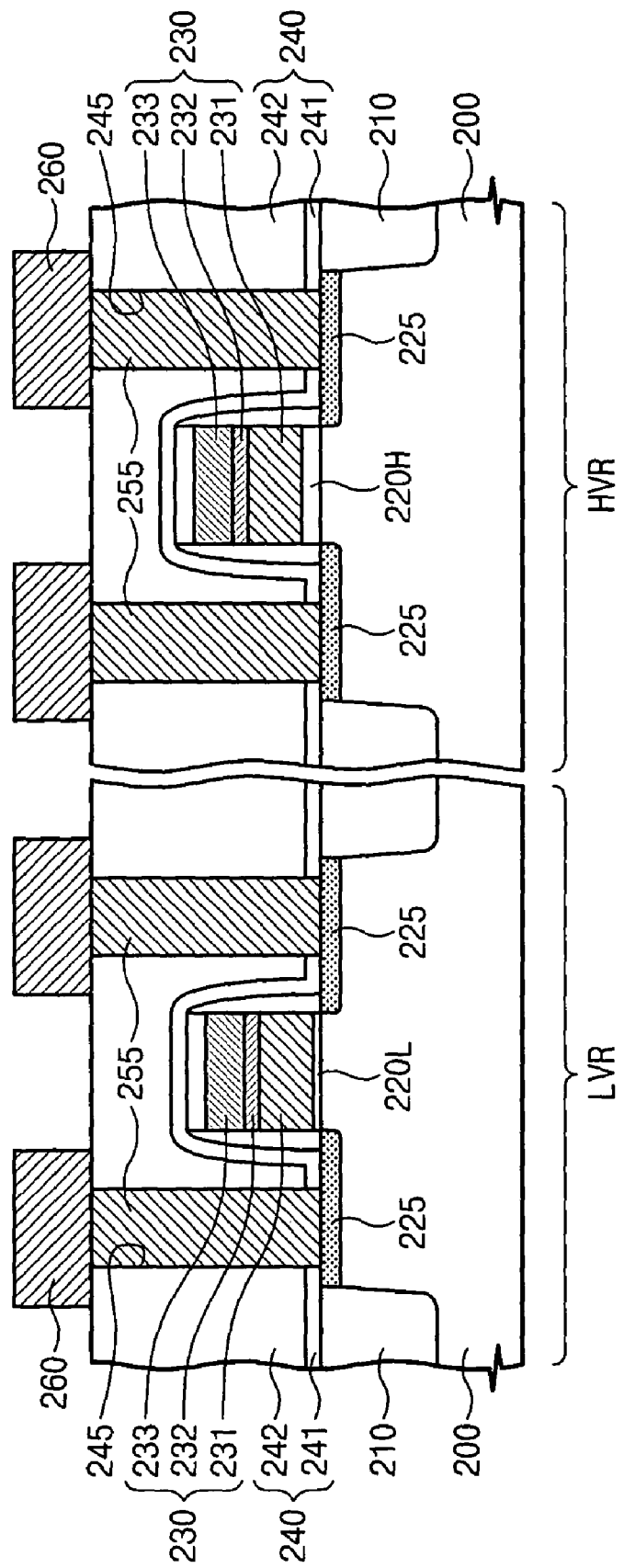
FIG. 11 illustrates a cross-sectional view of peripheral circuit transistors of FLASH memory device having a contact plug structure according to the present invention.
Figure 12:
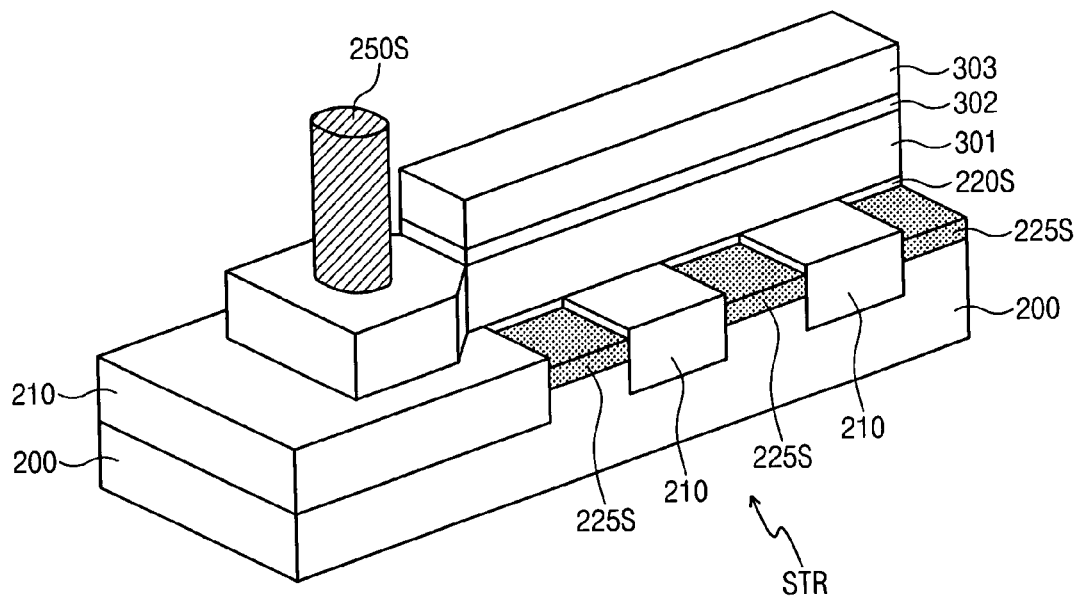
FIGS. 12 to 14 illustrate perspective views of a cell array of FLASH memory device having contact plug structures according to embodiments of the present invention.
Figure 13:
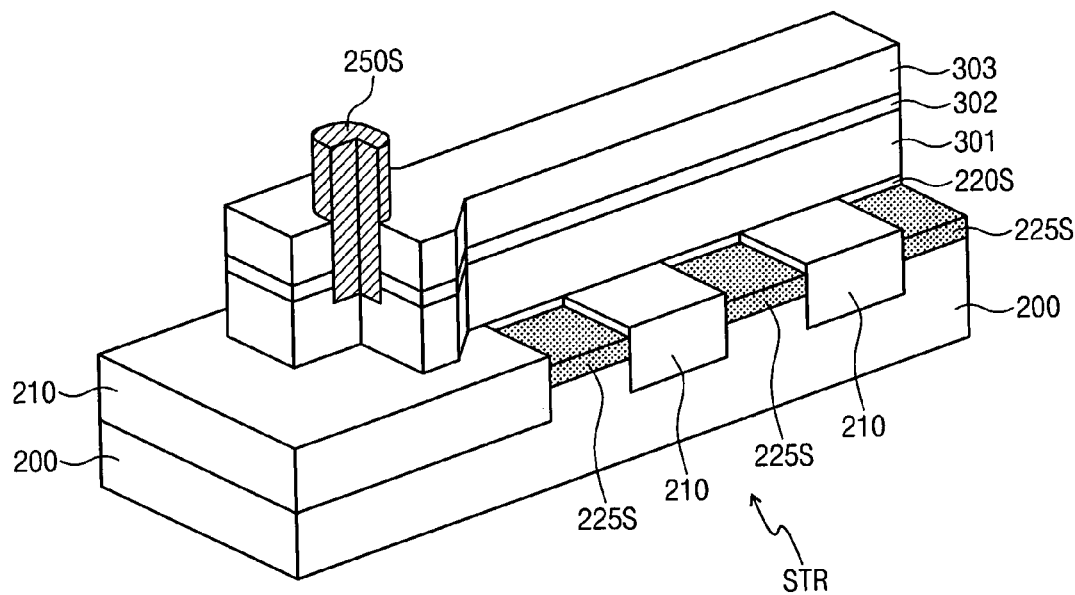
Figure 14:
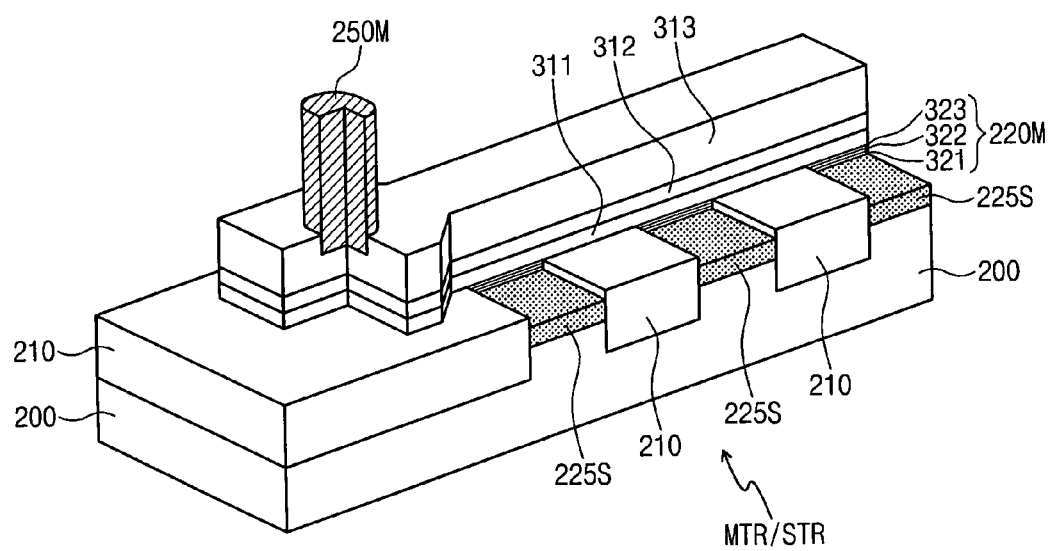

FIG. 8 illustrates a plane view of a cell array of a FLASH memory device having contact plug structure according to an embodiment of the present invention. FIG. 9 and FIG. 10 illustrate cross-sectional views of a cell array of a FLASH memory device having contact plug structures according to embodiments of the present invention. FIG. 11 illustrates a cross-sectional view of peripheral circuit transistors of a FLASH memory device having contact plug structures according to an embodiment of the present invention. FIGS. 12 to 14 illustrate perspective views of a cell array of a FLASH memory device having contact plug devices according to an embodiment of the present invention.

Referring to FIG. 8, device isolating layers 210 defining at least one active region may be formed on a semiconductor substrate 200. Gate patterns 230 may be on the active region. The semiconductor substrate 200 may include a cell array region and a peripheral circuit region. The cell array region may include a memory transistor region MTR and a selective transistor region STR on which memory transistors and selective transistors are respectively disposed. The peripheral circuit region, as shown in FIG. 11, may include a high voltage region HVR and a low voltage region LVR on which high voltage transistors and low voltage transistors are respectively disposed.

The gate patterns 230 may be disposed in a direction crossing the active region and the device isolating layer 210. The gate patterns 230 may include cell gate patterns 231 and selective gate patterns 232, which may be respectively disposed in the memory transistor region MTR and the selective transistor region STR. In addition, the gate patterns 230 may include peripheral gate patterns (see 233 of FIG. 11) in the high voltage region HVR and the low voltage region LVR.

The gate patterns 230 may include a first gate structure or a second gate structure. As illustrated in FIG. 12 and FIG. 13, the first gate structure may include a polysilicon layer 301, a first middle conductive layer 302 and a first top metal layer 303, which may be sequentially stacked. As illustrated in FIG. 14, the second gate structure may include a bottom conductive layer 311, a second middle conductive layer 312 and a second top metal layer 313, which may be sequentially stacked.

The first top metal layer 303 and the second top metal layer 313 may be made of at least one metal selected from, e.g., W, Cu, Al, Au, Ag, Pt, Pd, etc. Also, the first middle conductive layer 302 and the second middle conductive layer 312 may be made of at least one material selected from, e.g., $MN_x$, $MO_x$, $M_xSi_y$, $MSi_xAl_yN_z$, etc. The bottom conductive layer 311 may be one of $MN_x$ materials. The first and second middle conductive layers 302, 312 and the bottom conductive layer 311 may be composed of at least one material selected from, e.g., TaN, TiN, WN, etc. The $MO_x$ may be at least one selected from, e.g., $IrO_2$, $RuO_2$, etc. The $M_xSi_y$ may be at least one silicide selected from, e.g., WSi, TiSi, CoSi, etc. The metal nitrides composed of the silicon or aluminum may be at least one nitride selected from, e.g., TiSiN, TaAlN, TiAlN, etc.

The first top metal layer 303 and the second top metal layer 313 may be made of material of substantially the same type and thickness. The first middle conductive layer 302 and the second middle conductive layer 312 may be made of material of substantially the same type and thickness. Here, "substantially the same" means that a similar result capable of neglecting any process variations may be obtained by using the same process. The first top metal layer 303 and the second top metal layer 313 may be composed of W, and the first middle conductive layer 303 and the second middle conductive layer 312 may be composed of at least one of WN or W.

The selective gate patterns 232 and the peripheral gate patterns 233 may be the first gate structure, and the cell gate patterns 231 may be the second gate structure (See FIG. 9). According to another embodiment of the present invention, the peripheral gate patterns 233 may be the first gate structure, and the cell gate patterns 231 and the selective gate patterns 232 may be the second gate structure (See FIG. 10).

A charge storage layer 220M may be between the cell gate pattern 231 and the active region. The charge storage layer 220M may be formed of insulating layers composed of, e.g., silicon nitride. In this case, the FLASH memory may have a structure similar to conventional SONOS or MONOS memory devices. Preferably, the charge storage layer 220M may be a high dielectric layer 321, a silicon nitride layer 322 and a silicon oxide layer 323 stacked sequentially, as illustrated in FIG. 14. The high dielectric layer 321 may be formed from at least one selected from, e.g., tantalum oxide, titanium oxide, hafnium oxide, zirconium oxide, aluminum oxide, yttrium oxide, niobium oxide, cesium oxide, indium oxide, iridium oxide, barium strontium titanate (BST), lead zirconium titanate (PZT), etc. The charge storage layer 220M may have a sequentially stacked tunnel insulating layer, a floating gate electrode and a gate interlayer dielectric. In this case, a cell structure of the FLASH memory may be similar to that of the conventional floating gate FLASH memory device.

As illustrated in FIG. 9 and FIG. 10, cell impurity regions 225S may be formed in the active regions at both sides of cell gate patterns 231 and the selective gate patterns 232. A common source line CSL may be on one side of the memory transistor region MTR to connect the cell impurity regions 225S along a direction parallel with the gate pattern 230. Bit line contact plugs 255, which may be connected to each of the cell impurity regions 225S, may be on the other side of the memory transistor region MTR. The common source line CSL and the bit-line contact plugs 255 may be between the selective gate patterns 232, as illustrated in FIGS. 9 and 10. Each of the bit-line contact plugs 255 may be connected to the bit-lines 260 crossing over the gate patterns 230. An interlayer dielectric 240 may be between the bit-lines 260 and the gate patterns 230 to surround the bit-line contact plugs 255. The bit-lines 260 may be interconnections.

The gate insulating layer 220H in the high voltage region HVR may be thicker than the gate insulating layer 220L in the low voltage region LVR. The gate insulating layer 220H in the high voltage region HVR may be, e.g., a silicon oxide layer having a thickness of about 200 to about 400 Å. The gate insulating layer 220L in the low voltage region LVR may be, e.g., a silicon oxide layer having a thickness of about 50 Å to about 100 Å. Except for the difference in the thickness of the gate insulating layers, peripheral gate patterns and peripheral gate contact plugs may have substantially the same structure with those illustrated in FIG. 4 or FIG. 5.

The gate patterns 230 may be connected to the interconnections 260 through gate contact plugs. The gate contact plugs may include a first gate contact plug 250S connected to the first gate structure and a second gate contact plug 250M connected to the second gate structure. The first gate contact plug 250S may have a different structure from the second gate contact plug 250M. This difference between the gate contact plugs of the present invention will be discussed with reference to FIG. 12 to FIG. 14.

Referring to FIG. 12, the gate pattern may include the first gate structure having the sequentially stacked polysilicon layer 301, first middle conductive layer 302 and first top metal layer 303. The first middle conductive layer 302 and the first top metal layer 303 may expose a top surface of the polysilicon layer 301 at the selective gate contact region (SGC of FIG. 8). A first gate contact plug 250S connected to the interconnections 260 may be on the exposed top surface of the polysilicon layer 301. As a result, similar to the embodiment of the present invention described with reference to FIG. 7, the first gate contact plug 250S may be directly connected with the polysilicon layer 301, but it may be separated from the first middle conductive layer 302 and the first top metal layer 303.

Referring to FIG. 13, the gate pattern may also be on the first gate structure. According to this embodiment of the present invention, the first gate contact plug 250S may penetrate the first middle conductive layer 302 and the first top metal layer 303 to be connected to the polysilicon layer 301. The first gate contact plug 250S may therefore connect directly to all of the polysilicon layer 301, the first middle conductive layer 302 and the first top metal layer 303, as in the embodiment of the present invention described with reference to FIG. 6.

According to the aforementioned embodiments of the present invention, the first gate contact plug 250S may be in direct contact with the polysilicon layer 301. Therefore, an increase of interfacial resistance caused by non-ohmic contact, which has been observed in the related art, may not occur in the present invention.

Referring to FIG. 14, a gate pattern may be the second gate structure, which may include the sequentially stacked bottom conductive layer 311, second middle conductive layer 312, and second top metal layer 313. As described above, the bottom conductive layer 311 may be made of one of the metal nitrides. Therefore, even though the second gate contact plug 250M may be connected to the second top metal layer 313, the interfacial resistance problem due to non-ohmic contact may not occur in the second gate structure. As described above, the selective gate patterns 232 may be this second gate structure. In this case, the second gate contact plug may be used to connect the selective gate pattern 232 with the interconnections 260.

FIGS. 15A to 15D illustrate process cross-sectional views of stages of a method of manufacturing a semiconductor device according to an embodiment of the present invention. In FIGS. 15A to 15D, (a) and (b) illustrate cross-sectional views showing the transistors forming peripheral circuits, and (c) and (d) illustrate cross-sectional views showing a memory cell array of a FLASH memory. Here, (a) and (c) illustrate the cross-sectional view perpendicular to the gate patterns so that the source/drain contact plug may be seen, and (b) and (d) illustrate cross-sectional views parallel to the gate patterns so that the gate contact plug may be seen.

Figure 15A:
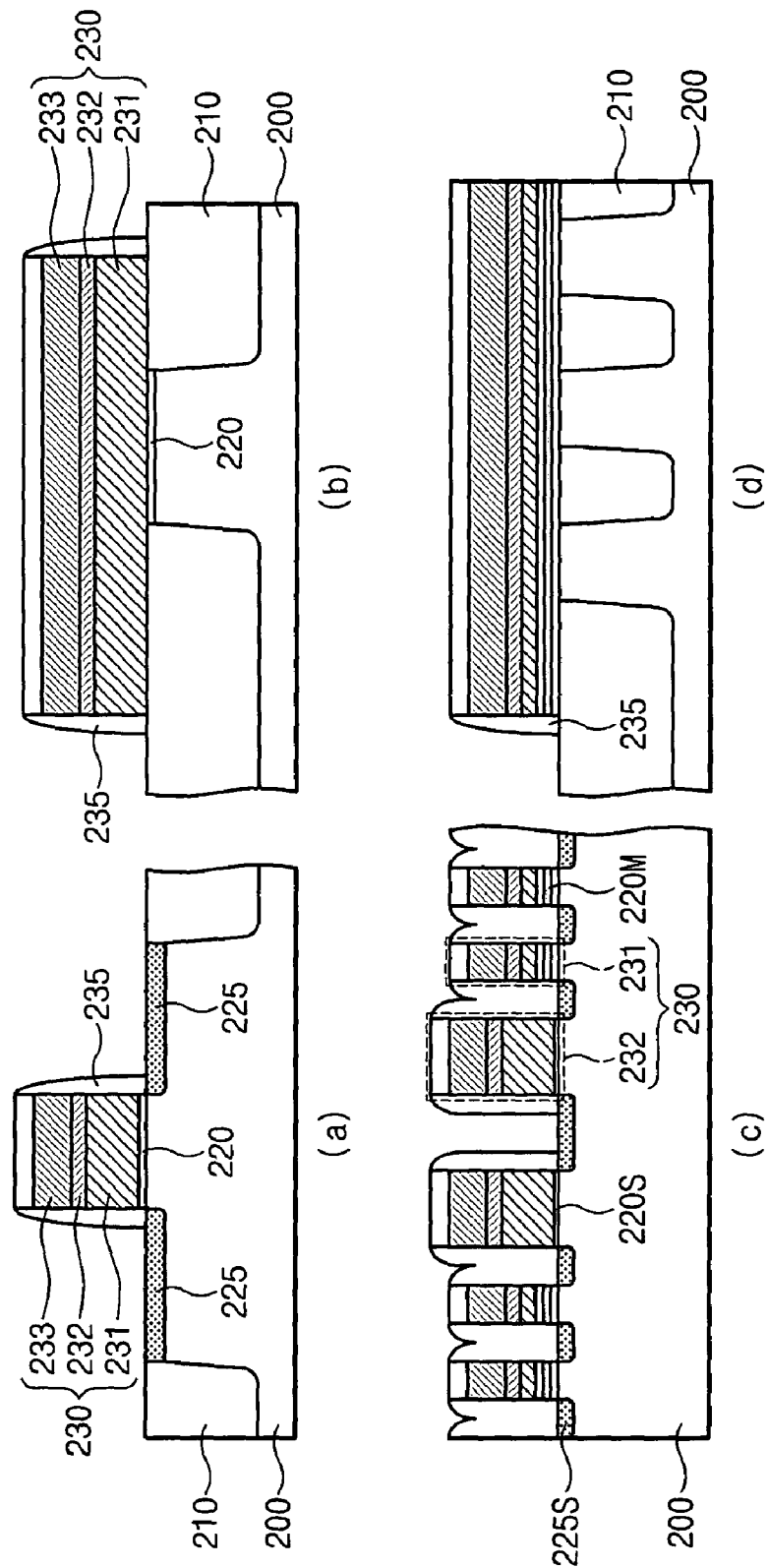
FIGS. 15A to 15D illustrate cross-sectional views of stages of a method of forming semiconductor device according to an embodiment of the present invention.

Referring to FIG. 15A, device isolating layers 210 defining active regions may be formed in a predetermined region of semiconductor substrate 200. Next, gate insulating layers 220, 220H, and 220L (See also FIG. 11) may be formed on the active region, and a gate structure may then be formed to cross over the active region. The gate structure may include the first gate structure used as the gate electrode of the transistor constructing peripheral circuit and the second gate structure used as the gate electrode of the memory cell transistor. The first and the second gate structures may be same as those illustrated in FIG. 12 to FIG. 14. The impurity regions 225 and 225S may be formed in the active region at both sides of the gate structures. Also, spacers 235 may be disposed on both sidewalls of the gate structure.

Figure 15B:
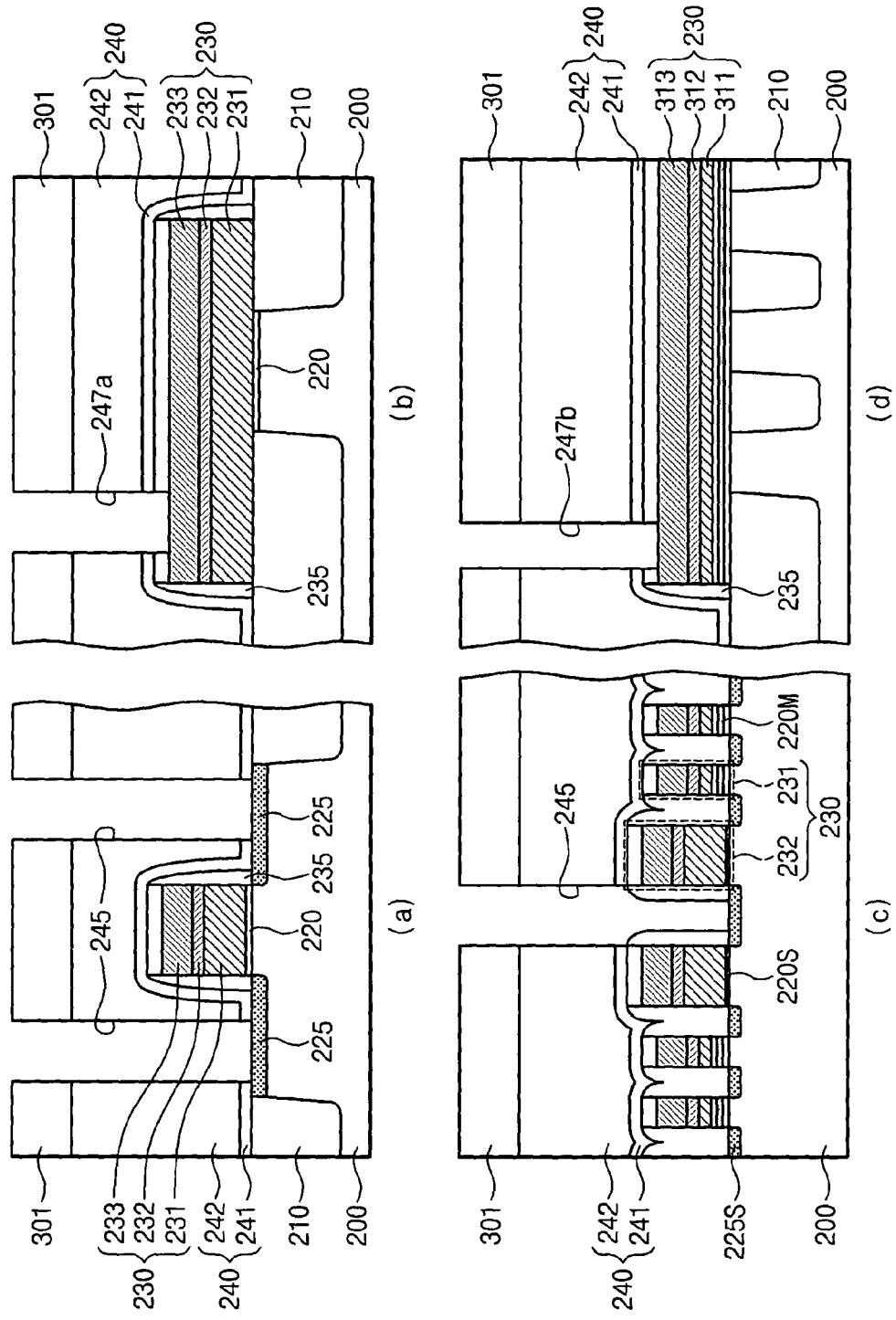

Referring to FIG. 15B, an interlayer dielectric 240 may be formed on the resultant structure where the impurity regions 225 and 225S are formed. The interlayer dielectric 240 may include a lower interlayer dielectric 241 covering and conforming to the resultant structure where the gate structure is formed. The interlayer dielectric 240 may also include an upper interlayer dielectric 242 on the lower interlayer dielectric 241. The lower interlayer dielectric 241 may be made of insulating material forming the silicon oxide layer and furthermore, may be made of material having etching selectivity with respect to the upper interlayer dielectric 242. The upper interlayer dielectric 242 may be, e.g., a silicon oxide layer, and the lower interlayer dielectric 241 may be, e.g., a silicon nitride layer.

Next, a first mask pattern 301 may be formed on the interlayer dielectric 240, and the interlayer dielectric 240 may be patterned using the first mask pattern 301 as an etch mask to form gate contact holes 247a and 247b and active contact holes 245, which may respectively expose the top surfaces of the gate pattern 230 and the impurity regions 225 and 225S. Preferably, the gate contact holes 247a and 247b may be formed over the device isolating layer 210. The gate contact holes may include the first gate contact hole 247a and the second gate contact hole 247b, which may be respectively formed on the first gate structure and the second gate structure.

Forming the gate contact holes and active contact hole 247a, 247b, and 245 may include anisotopically etching the upper interlayer dielectric 242 by using an etchant formulation having an etch selectivity with respect to the lower interlayer dielectric 241, and anisotopically etching the lower interlayer dielectric 241 by using an etchant formulation having an etch selectivity with respect to the semiconductor substrate 200. As a result of these etching processes, the top metal layers 303 and 313 of the gate patterns 230 may be exposed by the gate contact holes 247a and 247b.

Figure 15C:
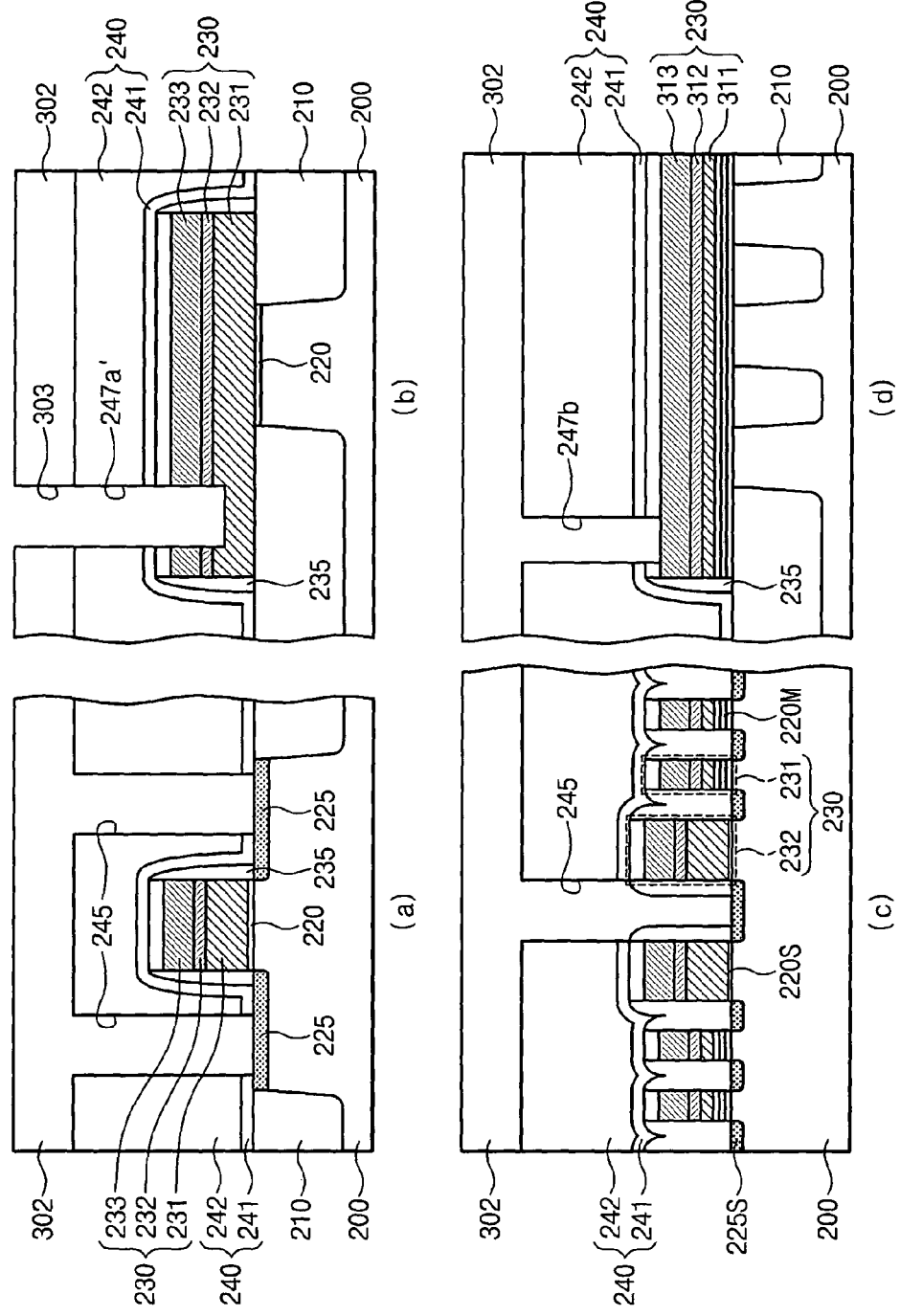

Referring to FIG. 15C, the first mask pattern 301 may be removed, and a second mask pattern 302 may be formed. Here, the second mask pattern 302 may be formed to define an opening 303 exposing the first gate contact hole 247a and the first top metal layer 233 of the first gate structure. Then, the first top metal layer 233 and the first middle conductive layer 232 may be etched by using the second mask pattern 302 as an etch mask to expose the polysilicon layer 231. As a result, the extended first gate contact hole 247a', which penetrates the first top metal layer 233 and the first middle conductive layer 232, may be formed to expose the polysilicon layer 231.

Figure 15D:
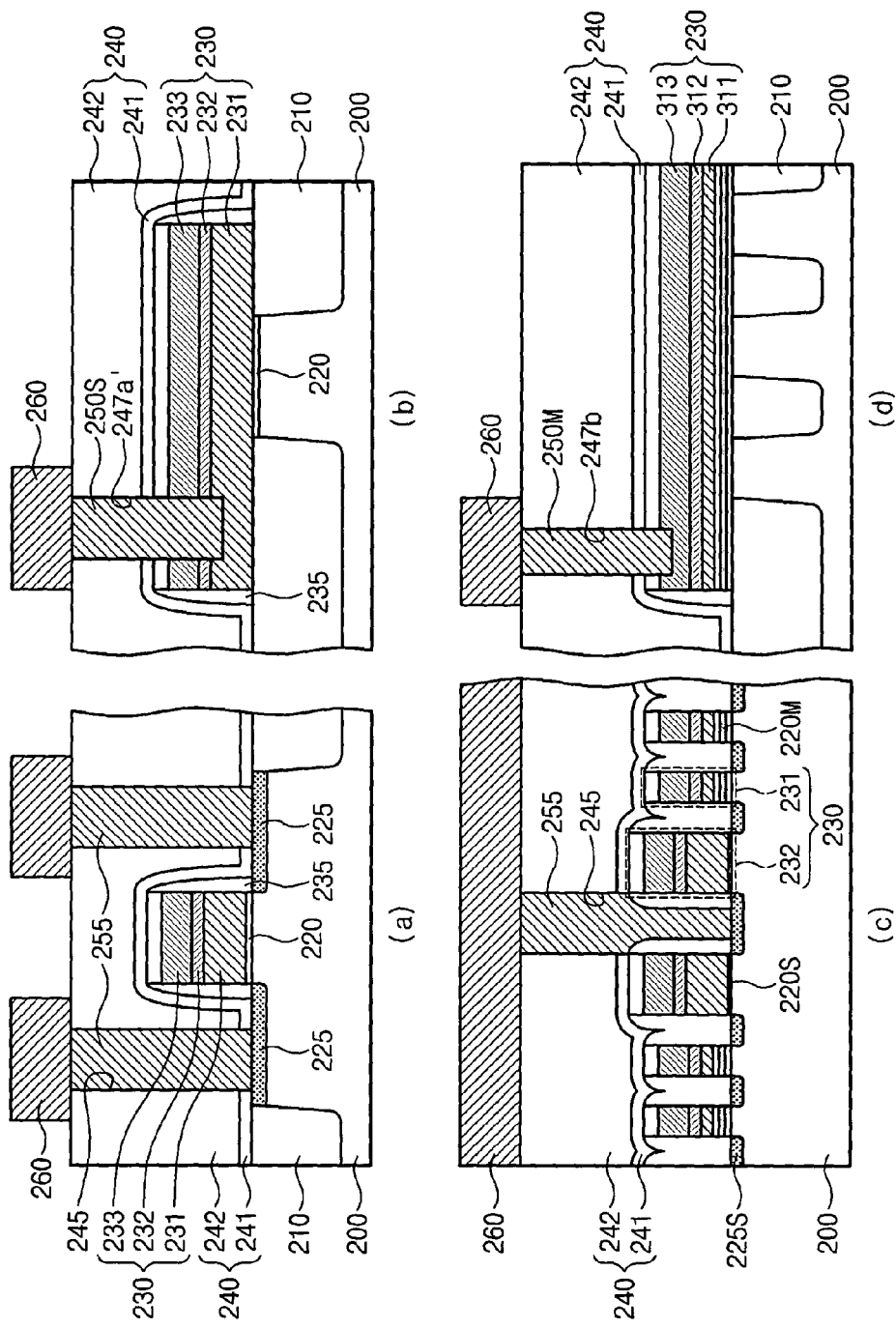

Referring to FIG. 15D, the second mask pattern 302 may be removed such that a top surface of the interlayer dielectric 240 having the extended first gate contact hole 247a', the second gate contact hole 247b and the active contact holes 245 are exposed. Next, a plug conductive layer may be formed to fill the contact holes 247a', 247b and 245, and the plug conductive layer may be planarized until the top surface of the interlayer dielectric 240 is exposed. As a result, the process may simultaneously form a first gate contact plug 250S, a second contact plug 250M and active contact plugs 255, which fill the extended first gate contact hole 247a', the second gate contact hole 247b and the active contact holes 245, respectively. Then, interconnections 260 may be formed to be connected with the contact plugs.

The extended first gate contact hole 247a' may expose the polysilicon layer 231 through the first top metal layer 233 and the first middle conductive layer 232. The first gate contact plug 250S may thus be in contact with all the first top metal later 233, the first middle conductive layer 232 and the polysilicon layer 231. Therefore, the interfacial resistance problem due to the aforementioned non-ohmic contact may not occur in this embodiment of the present invention.

Figure 16A:
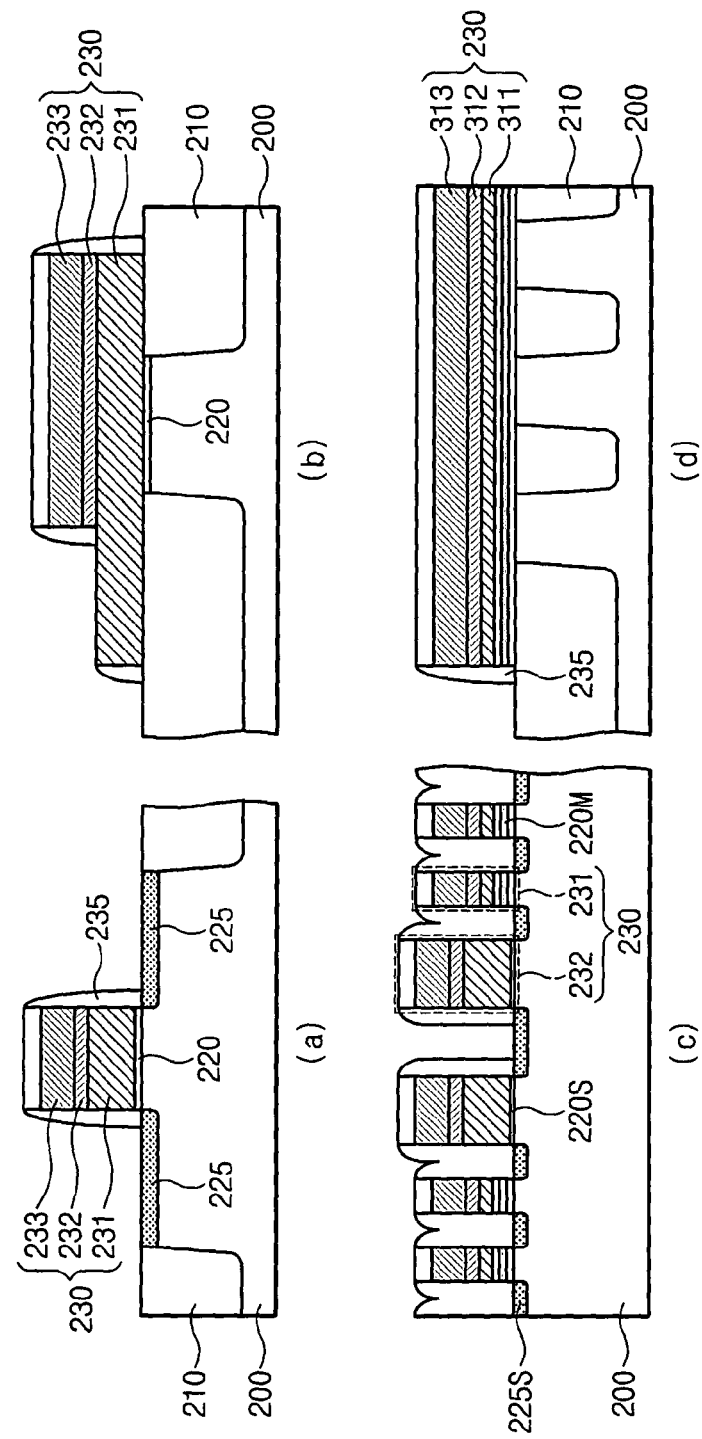
FIGS. 16A to 16B illustrate cross-sectional views of stages of a method of forming semiconductor device according to another embodiment of the present invention.
Figure 16B:
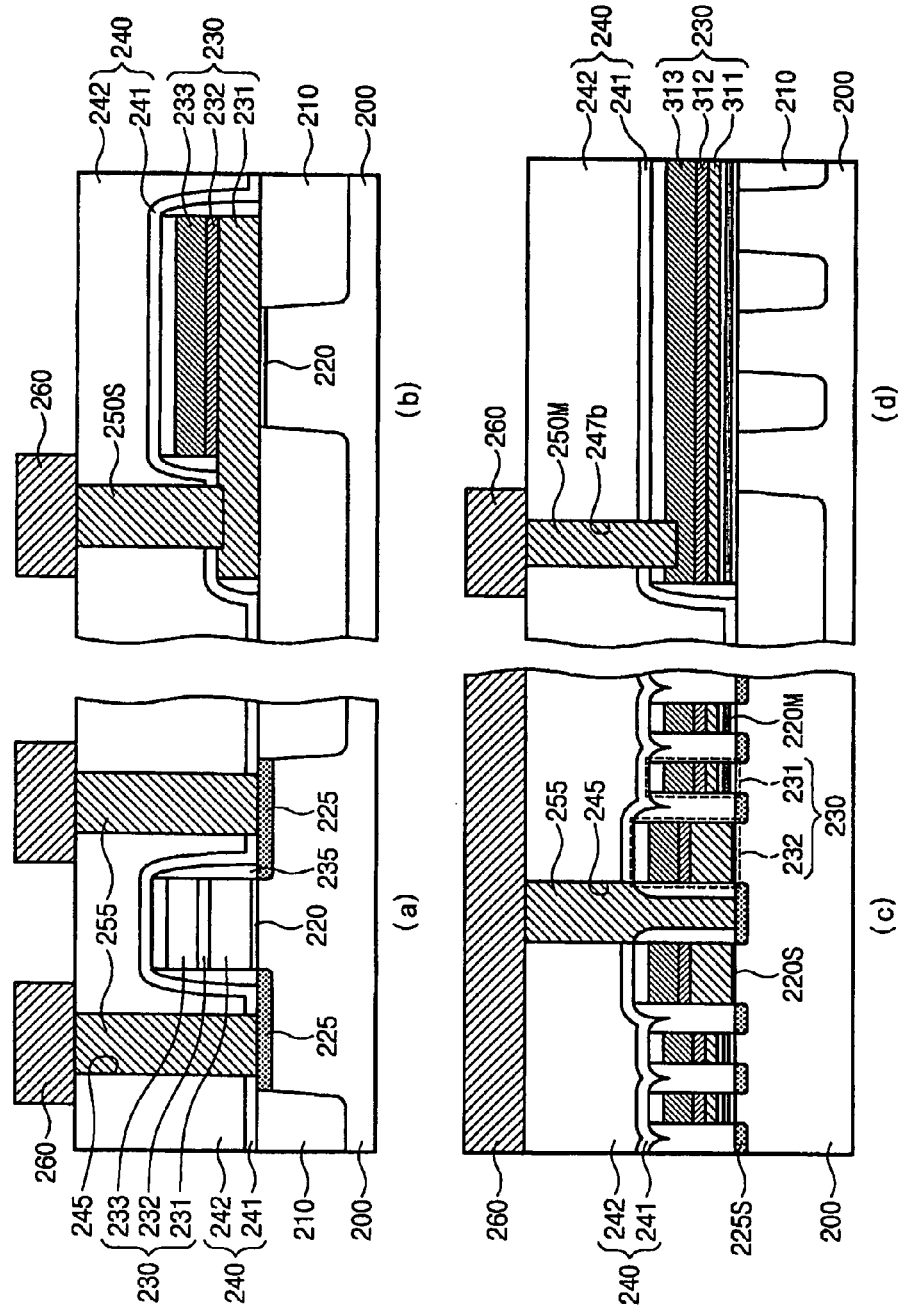

FIG. 16A and FIG. 16B illustrate a method of forming the semiconductor device according to another embodiment of the present invention. This embodiment of the present invention is related to the embodiment of the present invention of FIG. 7 and FIG. 12, and may be substantially the same as the embodiment of the present invention of FIG. 15A to FIG. 15D, except for the stages of forming the gate patterns. Therefore, redundant explanation will be omitted.

Referring to FIG. 16A and FIG. 16B, after forming the gate pattern 230, the first top metal later 233 and first middle conductive layer 232 of the first gate structure may be etched in the region where the first gate contact plug 255S will be formed. Therefore, the top surface of the polysilicon layer 231 may be exposed. As shown in FIG. 16B, the first gate contact plug 250S may be in direct contact with the polysilicon layer 231 of the first gate structure. As a result, an additional process for forming the extended first gate contact hole 247a' of the aforementioned embodiment may not be required.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of forming a semiconductor device, comprising:
   forming a first gate structure and a second gate structure on a semiconductor substrate, the first gate structure including a polysilicon layer, a first middle conductive layer, and a first top metal layer, and the second gate structure including a bottom conductive layer, a second middle conductive layer, and a second top metal layer stacked sequentially;
   forming an interlayer dielectric layer on the first and the second gate structures;
   forming a first gate contact hole and a second gate contact hole to expose top surfaces of the first and the second top metal layers by patterning the interlayer dielectric layer;
   forming an extended first gate contact hole to expose the polysilicon layer by selectively etching the first top metal layer exposed through the first gate contact hole; and
   forming contact plugs to fill the extended first gate contact hole and the second gate contact hole.

2. The method as claimed in claim 1, wherein the bottom conductive layer includes at least one metal nitride, and the first middle conductive layer and the second middle conductive layer respectively include at least one metal nitride, conductive metal oxide, metal silicide, or metal nitride including silicon or aluminum.

3. The method as claimed in claim 1, further comprising:
   forming an etch stopping layer covering and conforming to the first and the second gate structures,
   wherein forming the first and the second gate contact holes includes:
   patterning the interlayer dielectric layer using an etchant formulation having etch selectivity to the etch stopping layer; and
   patterning the etch stopping layer exposed through the patterned interlayer dielectric layer to expose top surfaces of the first and the second top metal layers.

4. The method as claimed in claim 1, wherein patterning the interlayer dielectric layer further comprises:
   forming source/drain contact holes exposing the semiconductor substrate at sides of the first and the second gate structures,
   wherein the source/drain contact holes are formed simultaneously when the first and the second gate contact holes are formed.

5. The method as claimed in claim 1, wherein forming the extended first gate contact hole comprises:
   forming a mask pattern covering the second gate contact hole and exposing the first gate contact hole; and
   etching the first gate contact hole using the mask pattern as an etch mask.

6. The method as claimed in claim 1, wherein the contact plug filling the first gate contact hole is directly connected with the polysilicon layer, the first middle conductive layer, and the first top metal layer, and the contact plug filling the second gate contact hole is directly connected with the bottom conductive layer, the second middle conductive layer, and the second top metal layer.

7. A method of forming a semiconductor device, comprising:
   forming a first gate structure and a second gate structure on a semiconductor substrate, the first gate structure including a first bottom conductive layer and a first top metal layer, the first top metal layer exposing a portion of a top surface of the first bottom conductive layer, and the second gate structure including a second bottom conductive layer and a second top metal layer;
   forming an interlayer dielectric layer on the first and the second gate structures;
   patterning the interlayer dielectric layer to form a first gate contact hole and a second gate contact hole respectively exposing top surfaces of the first bottom conductive layer of the first gate structure and the second top metal layer of the second gate structure, the first gate contact hole being spaced apart from the first top metal layer adjacent thereto; and forming contact plugs connected with the first bottom conductive layer and the second top metal layer through the first gate contact hole and the second contact hole.

8. The method as claimed in claim 7, wherein the first gate structure further includes a first middle conductive layer between the first bottom conductive layer and the first top metal layer, and the second gate structure further includes a second middle conductive layer between the second bottom conductive layer and the second top metal layer, and wherein the second bottom conductive layer includes at least one metal nitride, conductive metal oxide, metal silicide, or metal nitride including at least one of silicon or aluminum.

9. The method as claimed in claim 7, further comprising:
forming source/drain contact holes exposing the semiconductor substrate at sides of the first and the second gate structures,
wherein the source/drain contact holes are formed simultaneously when the first and the second gate contact holes are formed.

10. The method as claimed in claim 7, wherein the first gate contact hole is formed on a top surface of the first bottom conductive layer exposed by the first top metal layer, such that the interlayer dielectric is interposed between the contact plug and an internal sidewall of the first gate contact hole.

11. A method of forming a semiconductor device, comprising:
forming a first gate structure and a second gate structure on a semiconductor substrate, the first gate structure including a first bottom conductive layer and a first top metal layer, and the second gate structure including a second bottom conductive layer and a second top metal layer stacked sequentially;
forming an interlayer dielectric layer on the first and the second gate structures;
forming a first gate contact hole and a second gate contact hole to expose top surfaces of the first and the second top metal layers by patterning the interlayer dielectric layer;
forming an extended first gate contact hole to expose the first bottom conductive layer by selectively etching the first top metal layer exposed through the first gate contact hole; and
forming contact plugs to fill the extended first gate contact hole and the second gate contact hole.

12. The method as claimed in claim 11, wherein the first gate structure further includes a first middle conductive layer between the first bottom conductive layer and the first top metal layer, and the second gate structure further includes a second middle conductive layer between the second bottom conductive layer and the second top metal layer,
wherein the first middle conductive layer and the second middle conductive layer respectively include at least one metal nitride, conductive metal oxide, metal silicide, or metal nitride including silicon or aluminum.

13. The method as claimed in claim 11, further comprising:
forming an etch stopping layer covering and conforming to the first and the second gate structures,
wherein forming the first and the second gate contact holes includes:
patterning the interlayer dielectric layer using an etchant formulation having etch selectivity to the etch stopping layer; and
patterning the etch stopping layer exposed through the patterned interlayer dielectric layer to expose top surfaces of the first and the second top metal layers.

14. The method as claimed in claim 11, wherein patterning the interlayer dielectric layer further comprises:
forming source/drain contact holes exposing the semiconductor substrate at sides of the first and the second gate structures,
wherein the source/drain contact holes are formed simultaneously when the first and the second gate contact holes are formed.

15. The method as claimed in claim 11, wherein the first top metal layer and the second top metal layer are formed of a substantially same material, and the first top metal layer and the second top metal layer have a substantially same thickness.

16. The method as claimed in claim 11, wherein each of the first top metal layer and the second top metal layer are formed of at least one of tungsten, copper, aluminum, gold, silver, platinum, or palladium.

17. The method as claimed in claim 11, further comprising:
a first middle conductive layer between the first top metal layer and the first bottom conductive layer; and
a second middle conductive layer between the second top metal layer and the second bottom conductive layer.

18. The method as claimed in claim 17, wherein the first middle conductive layer and the second middle conductive layer are made of a substantially same material having a substantially same thickness.

19. The method as claimed in claim 12, wherein:
the metal nitride includes at least one of TaN, TiN or WN;
the conductive metal oxide includes at least one of $IrO_2$ or $RuO_2$;
the metal silicide includes at least one of WSi, TiSi or CoSi; and
the metal nitride including at least one of silicon or aluminum includes at least one of TiSiN, TaSiN, TaAlN or TiAlN.

20. The method as claimed in claim 11, wherein:
forming the semiconductor substrate includes forming a memory cell array region where memory transistors and selective transistors are arrayed, and forming a peripheral circuit region where peripheral transistors connected to the memory and the selective transistors are arrayed;
the memory transistors are non-volatile memory transistors each having a memory gate insulating layer and a charge storage structure stacked sequentially between a gate electrode and the semiconductor substrate;
the peripheral transistors are MOS transistors each having a peripheral gate insulating layer between a gate electrode and the semiconductor substrate; and
the selective transistors are MOS transistors each having a selective gate insulating layer between a gate electrode and the semiconductor substrate.

21. The method as claimed in claim 11, wherein
the first gate structure is at least one gate electrode of the selective transistors and the peripheral transistors; and
the second gate structure is at least one gate electrode of the memory transistors and the selective transistors.

* * * * *